(12) United States Patent
Zettler

(10) Patent No.: US 7,424,657 B2
(45) Date of Patent: Sep. 9, 2008

(54) METHOD AND DEVICE FOR TESTING AN INTEGRATED CIRCUIT, INTEGRATED CIRCUIT TO BE TESTED, AND WAFER WITH A LARGE NUMBER OF INTEGRATED CIRCUITS TO BE TESTED

(75) Inventor: Thomas Zettler, Höhenkirchen-Siegertsbrunn (DE)

(73) Assignee: Infineon Technologies AG, Munich (DE)

(*) Notice: Subject to any disclaimer, the term of this patent is extended or adjusted under 35 U.S.C. 154(b) by 1461 days.

(21) Appl. No.: 09/922,479

(22) Filed: Aug. 3, 2001

(65) Prior Publication Data

US 2002/0019964 A1  Feb. 14, 2002

(30) Foreign Application Priority Data

Aug. 3, 2000  (DE) .............................. 100 37 794

(51) Int. Cl.
G01R 31/28  (2006.01)

(52) U.S. Cl. ........................................ 714/733; 714/734

(58) Field of Classification Search ................ 714/733, 714/734, 724, 30, 726, 718, 738; 324/537, 324/765; 365/201, 200; 716/4; 326/30
See application file for complete search history.

(56) References Cited

U.S. PATENT DOCUMENTS

| | | | | |
|---|---|---|---|---|
| 4,945,536 A * | 7/1990 | Hancu ........................ | 714/727 |
| 4,961,053 A | 10/1990 | Krug | |
| 5,241,266 A | 8/1993 | Ahmad et al. | |
| 5,355,081 A | 10/1994 | Nakata et al. | |
| 5,388,104 A * | 2/1995 | Shirotori et al. ............. | 714/718 |
| 5,570,374 A * | 10/1996 | Yau et al. .................... | 714/733 |
| 6,067,262 A * | 5/2000 | Irrinki et al. ................ | 365/201 |
| 6,249,893 B1 * | 6/2001 | Rajsuman et al. ........... | 714/741 |
| 6,333,878 B2 * | 12/2001 | Ooishi ........................ | 365/200 |
| 6,456,101 B2 * | 9/2002 | Dumbri ...................... | 324/763 |
| 6,459,290 B1 * | 10/2002 | Nishikawa et al. .......... | 324/763 |
| 6,463,560 B1 * | 10/2002 | Bhawmik et al. ........... | 714/733 |
| 6,463,561 B1 * | 10/2002 | Bhawmik et al. ........... | 714/733 |

(Continued)

FOREIGN PATENT DOCUMENTS

EP  0 492 624 A1  7/1992

(Continued)

OTHER PUBLICATIONS

Rangarajan, Sampath et al.: "Built-In Testing of Integrated Circuit Wafers", IEEE Transactions on Computers, vol. 39, No. 2, Feb. 1990, pp. 195-205.

*Primary Examiner*—Phung M Chung
(74) *Attorney, Agent, or Firm*—Laurence A. Greenberg; Werner H. Stemer; Ralph E. Locher

(57) ABSTRACT

A method and a device for testing an integrated circuit are defined by the fact that the testing of the integrated circuit is begun by a self-test device contained in the integrated circuit before the integrated circuit is connected to an external testing device that reads out and/or evaluates the results of the self test. The integrated circuit and the wafer are constructed in such a way that this is readily possible with little outlay. An integrated circuit that includes the self-test device and a wafer including such integrated circuits is also disclosed.

25 Claims, 13 Drawing Sheets

U.S. PATENT DOCUMENTS

| | | | |
|---|---|---|---|
| 6,557,130 B1 | 4/2003 | Krasser et al. | |
| 6,574,762 B1 * | 6/2003 | Karimi et al. | 714/727 |
| 6,651,202 B1 * | 11/2003 | Phan | 714/733 |
| 6,681,359 B1 * | 1/2004 | Au et al. | 714/733 |
| 7,080,301 B2 * | 7/2006 | Dervisoglu et al. | 714/733 |

FOREIGN PATENT DOCUMENTS

| | | |
|---|---|---|
| EP | 0 568 239 A2 | 11/1993 |
| EP | 0 803 902 A2 | 10/1997 |
| EP | 0 974 847 A2 | 1/2000 |
| JP | 00 124 279 A | 4/2000 |
| JP | 2000 137 059 | 5/2000 |

\* cited by examiner

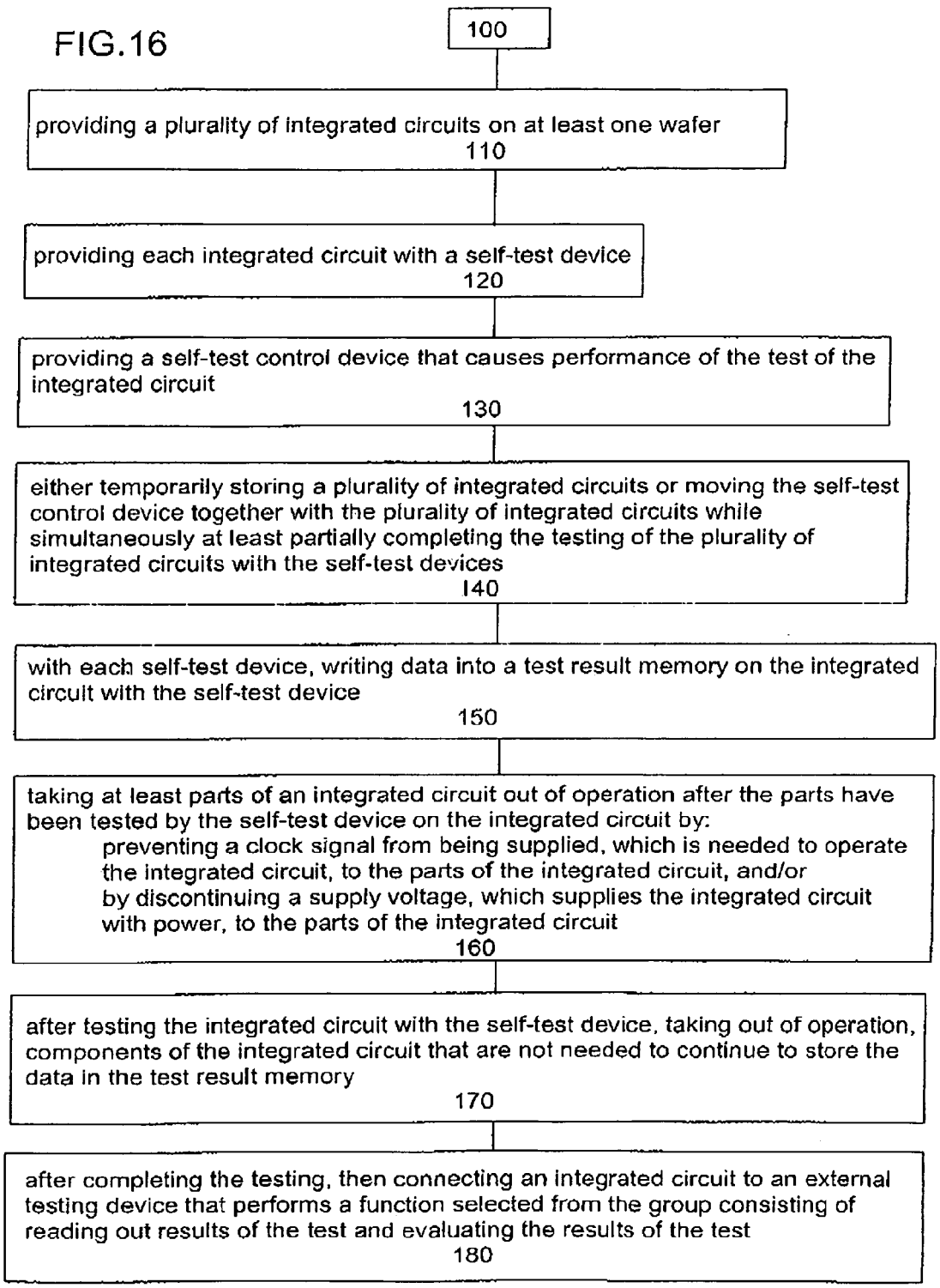

METHOD AND DEVICE FOR TESTING AN INTEGRATED CIRCUIT, INTEGRATED CIRCUIT TO BE TESTED, AND WAFER WITH A LARGE NUMBER OF INTEGRATED CIRCUITS TO BE TESTED

BACKGROUND OF THE INVENTION

Field of the Invention

The present invention relates to a method and to a device for testing an integrated circuit using a self-test device contained in the integrated circuit. The present invention also relates to an integrated circuit with a self-test device, and to a wafer with a large number of integrated circuits.

Integrated circuits and methods for their production have been known for many years in an extremely wide range of embodiments.

It is likewise known that integrated circuits, semiconductor chips containing integrated circuits or components containing semiconductor chips have to be tested during or after their production.

In this case, integrated circuits which are not operating properly are repaired by deactivating the faulty parts and activating equivalent redundant parts (this is often the case, in particular, in memory modules), or if this is not possible, the faulty parts are separated out.

Various possible ways of testing integrated circuits are known. The most widespread method consists of connecting the integrated circuits still located on the wafer, or the semiconductor chips already cut out of the wafer, or the semiconductor chips already provided with a housing, to an external testing device and then testing them by supplying suitable test signals.

Additionally or alternatively, the testing of integrated circuits can also be carried out by using self-test devices which are integrated in the integrated circuits and are frequently also referred to as built-in self-test modules or BIST modules. BIST modules which operate particularly efficiently are disclosed, for example, by European Publication EP 0 492 624 A1, U.S. Pat. No. 5,388,104, European Publication EP 0 568 239 A2, U.S. Pat. No. 5, 570, 374, and by Sampath Rangarajan et al.: "Built-In Testing of Integrated Circuit Wafers", IEEE Transactions on Computers, Vol. 39, No. 2, February 1990, pages 195 ff. With the assistance of such or other BIST modules, the integrated circuits can, at least to some extent, check themselves for freedom from faults.

Experience shows that the testing of integrated circuits is becoming increasingly more complicated and more costly, in spite of test methods becoming better and better and more and more efficient. The facts which are responsible for this are, in particular:

The clock frequency at which the integrated circuits are operated is continually increasing (this makes it increasingly more complicated to carry out the tests under the real operating conditions);

The clock frequency at which the integrated circuits are operated is increasing less rapidly than the number of constituents to be tested, such as the memory cells of a memory to be tested in the integrated circuit (this leads to the test time becoming increasingly longer); and The number of components present in the integrated circuit is increasing sharply, while the number of input and/or output terminals on the integrated circuits is increasingly comparatively little (this leads to an increasingly more difficult and more time-consuming ability to observe the integrated circuit).

The ever more complicated and more time-consuming tests of integrated circuits have the negative effect that the testing of the integrated circuits gives rise to higher and higher costs. This is understandably a disadvantage.

SUMMARY OF THE INVENTION

It is accordingly an object of the invention to provide an apparatus and a method for testing integrated circuits which overcomes the above-mentioned disadvantages of the prior art apparatus and methods of this general type. In particular, it is an object of the invention to test integrated circuits rapidly and simply.

With the foregoing and other objects in view there is provided, in accordance with the invention, a method of testing an integrated circuit, that includes: providing an integrated circuit that includes a self-test device; starting to perform a test of the integrated circuit with the self-test device; and subsequently, connecting the integrated circuit to an external testing device that performs a function selected from the group consisting of reading out results of the test and evaluating the results of the test.

In accordance with an added mode of the invention, the test is completed before performing the step of connecting the integrated circuit to the external testing device.

In accordance with an additional mode of the invention, the test is at least partially completed while performing a function selected from the group consisting of temporarily storing the integrated circuit and transporting the integrated circuit to the external testing device.

In accordance with another mode of the invention, the method includes steps of: providing a self-test control device that causes performance of the test of the integrated circuit; and moving the control device together with the integrated circuit.

In accordance with a further mode of the invention, the method includes a step of taking at least parts of the integrated circuit out of operation after the parts have been tested by the self-test device.

In accordance with a further added mode of the invention, the method includes steps of: with the self-test device, writing data into a test result memory; and after testing the integrated circuit with the self-test device, taking out of operation, components of the integrated circuit that are not needed to continue to store the data in the test result memory.

In accordance with a further additional mode of the invention, the step of taking at least parts of the integrated circuit out of operation includes not supplying a clock signal, which is needed to operate the integrated circuit, to the parts of the integrated circuit.

In accordance with another further mode of the invention, the step of taking at least parts of the integrated circuit out of operation includes not supplying a supply voltage, which supplies the integrated circuit with power, to the parts of the integrated circuit.

In accordance with yet a further added mode of the invention, the method includes simultaneously testing a plurality of integrated circuits with the self-test device.

In accordance with yet a further additional mode of the invention, the method includes a step of providing the plurality of the integrated circuits on at least one wafer.

With the foregoing and other objects in view there is provided, in accordance with the invention, an apparatus for testing an integrated circuit using a self-test device that is located in the integrated circuit. The apparatus includes a self-test control device for causing testing of the integrated circuit by the self-test device before the integrated circuit is connected to an external testing device that performs a function selected from the group consisting of reading out results of the test and evaluating the results of the test.

In accordance with an added feature of the invention, the self-test control device is configured to complete the testing of the integrated circuit before the integrated circuit is connected to the external testing device.

In accordance with an additional feature of the invention, the self-test control device is configured to test the integrated circuit while allowing a function, selected from the group consisting of temporarily storing the integrated circuit and transporting the integrated circuit to the external testing device, to be performed.

In accordance with another feature of the invention, the self-test control device is constructed to be moved together with the integrated circuit.

In accordance with a further feature of the invention, the external testing device tests aspects of the integrated circuit that are not tested by the self-test device, the aspects selected from the group consisting of components of the integrated circuit and functions of the integrated circuit.

With the foregoing and other objects in view there is provided, in accordance with the invention, an integrated circuit, that includes: components; a self-test device for testing the components; and a device for, at a particular time, taking specific ones of the components out of operation. The particular time is selected from the group consisting of during the testing and after the testing.

In accordance with an added feature of the invention, there is provided, a test result memory for receiving data from the self-test device and for storing the data; the specific ones of the components being ones of the components that are not needed in order to continue to store the data stored in the test result memory.

In accordance with an additional feature of the invention, the device prevents a clock signal, which is needed to operate the components, from being applied to the specific ones of the components.

In accordance with another feature of the invention, the device prevents a supply voltage, which is needed to operate the components, from being applied to the specific ones of the components.

In accordance with a further feature of the invention, there is provided: a test result memory for receiving data from the self-test device and for storing the data; and a device for insuring that the data can not be changed after completion of the testing by the self-test device.

In accordance with a further added feature of the invention, there is provided, a test result memory for receiving data from the self-test device and for storing the data; and a device for using the data stored in the test result memory to determine whether the testing has been completed.

In accordance with a further additional feature of the invention, there is provided, at least two different points for receiving voltages and signals that have to be supplied so that the self-test device can test the components.

In accordance with yet an added feature of the invention, the at least two different points are electrically connected together.

With the foregoing and other objects in view there is also provided, in accordance with the invention, a wafer that includes, a plurality of integrated circuits that are configured for being separated apart by a subsequent cutting process. The plurality of the integrated circuits are at least partially electrically connected to one another.

In accordance with an added feature of the invention, there is provided, a wafer substrate; and electrical connections formed by conductor tracks that are located on the wafer substrate and that electrically connect the plurality of the integrated circuits.

In accordance with an additional feature of the invention, there is provided, a self-test device located in the plurality of the integrated circuits. The plurality of the integrated circuits include points to which signals selected from the group consisting of voltages and test signals must be supplied such that the self-test device can test the plurality of the integrated circuits.

In accordance with another feature of the invention, there is provided, a wafer substrate; and electrical connections formed by conductor tracks that are located on the wafer substrate and that electrically connect the plurality of the integrated circuits. The wafer substrate includes contact zones that are constructed such that voltages and signals applied to them can be led onward, via the electrical connections to a number of the plurality of the integrated circuits. The number of the plurality of the integrated circuits are selected from the group consisting of all of the plurality of the integrated circuits and some of the plurality of the integrated circuits.

In accordance with a concomitant feature of the invention, there is provided, a self-test device located in the plurality of the integrated circuits. The contact zones include at least two different contact zones for receiving the voltages and the signals such that the plurality of the integrated circuits can be tested by the self-test device.

The fact that the testing of the integrated circuit by the self-test device is begun before the integrated circuit is connected to an external testing device that reads out and/or evaluates the results of the self test means that the residence time of the integrated circuit on the external testing device can be minimal, that is to say the external testing device is therefore utilized most efficiently.

Other features which are considered as characteristic for the invention are set forth in the appended claims.

Although the invention is illustrated and described herein as embodied in a method and device for testing an integrated circuit, integrated circuit to be tested, and wafer with a large number of integrated circuits to be tested, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 11A to 11C show a device by means of which a wafer lying on a carrier can be removed from the carrier without interrupting the supply of voltages or signals fed to it;

FIG. 16 shows a block diagram illustrating method steps.

DESCRIPTION OF THE PREFERRED EMBODIMENTS

Figure 1:
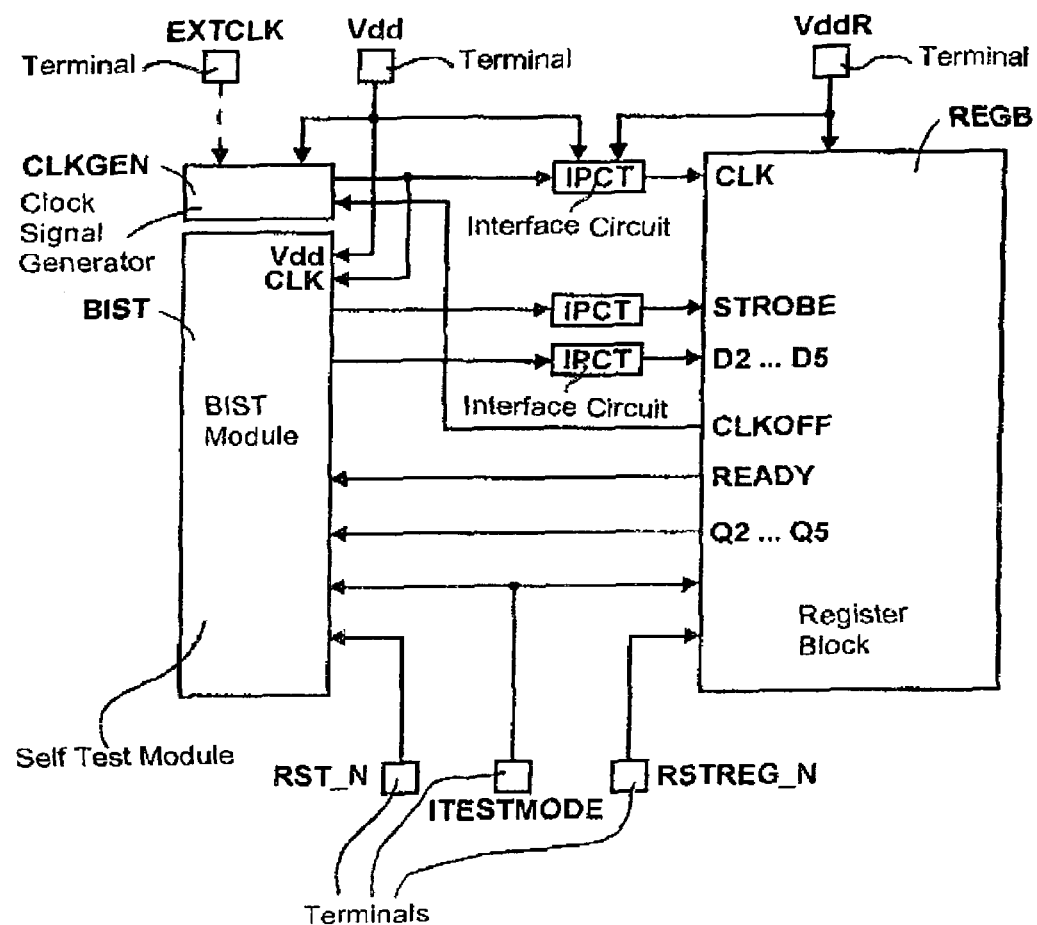
FIG. 1 shows the construction of an integrated circuit containing a self-test device.

By means of the measures described in more detail below, integrated circuits may be tested rapidly and simply. The measures relate to constructing an integrated circuit to be tested, and to the wafer that is used for simultaneously producing a plurality of integrated circuits and which, at the end of production, carries a large number of integrated circuits. The measures also relate to a method and to devices for testing the integrated circuits.

It is possible for the integrated circuits to be tested particularly rapidly and simply if use is made of all of the special features described. However, the integrated circuits can be tested more rapidly and more simply than was previously possible even if use is made only of individual or of several of the special features described below.

The integrated circuits to be tested are, in the example considered, semiconductor circuits that are implemented using CMOS technology (systems on silicon), but they can also be any other desired circuits. They are a constituent part of a semiconductor chip or will be further processed to form a semiconductor chip. The function of the integrated circuits to be tested is not subject to any restrictions.

The integrated circuits considered contain a self-test device, using which, they can themselves test certain components or functions. In the example considered, the self-test device is a built-in self-test module or BIST module, as it is known.

As will be described more precisely later, in response to an external request, the BIST module carries out a test of the components and functions of the integrated circuit that can be tested by it (for example of a memory contained in the integrated circuit) and writes the result of this self test into a test result memory (likewise contained in the integrated circuit). The test result stored in the test result memory is output by the integrated circuit to an external testing device when requested by the latter and is evaluated there. This external testing device in the example considered is a testing device which, in addition to evaluating the results of the self test of the integrated circuit, in addition tests those components or functions of the integrated circuit which cannot be or are not tested by the BIST module, or only partially so, by supplying suitable signals and by evaluating the reaction to these.

In the example considered, the test of the integrated circuit by the BIST module contained therein is begun before the integrated circuit is connected to the external testing device, for example, as early as during temporary storage of the relevant integrated circuit and/or during the transport of the relevant integrated circuit to the external testing device. The test of the integrated circuit by the BIST module contained therein has preferably already been concluded when the integrated circuit is connected to the external testing device.

As a result, after producing the connection to the integrated circuit to be tested, the external testing device can immediately begin: reading out and evaluating the results of the test carried out by the BIST module, and testing the components and functions of the integrated circuit which are not tested by the BIST module.

Since the external testing device does not itself have to perform the initiation of the test to be carried out by the BIST module, and does not then have to wait until the end of this test before it can begin with reading out and evaluating the results of the test carried out by the BIST module and/or continue testing of the integrated circuit to be tested, the residence time of the integrated circuit to be tested on the external testing device is minimal, and the utilization of the external testing device is optimal.

Shortening the residence time of the integrated circuit to be tested on the external testing device may appear to be unimportant. However, if one takes account of the immense number of integrated circuits which have to be tested by the external testing device over the course of time, then, even if only a fraction of a second can be saved on each integrated circuit, the result is an enormous saving in time.

The initiation and the implementation of the test to be carried out by the BIST test module without concomitant action by the external testing device does not present any kind of problems. As will be better understood later on, for this purpose it is merely necessary to make contact with only a few terminals of the integrated circuit and to apply to them the voltages and signals needed to initiate the test; the test itself can proceed automatically (without any external control).

Referring now to the figures of the drawing in detail and first, particularly, to FIG. 1 thereof, there is shown an integrated circuit that is particularly suitable for the above-described procedure. For completeness, it should be noted that, of this integrated circuit, only the BIST module, the test result memory and the constituent parts of the integrated circuit that are needed for its proper operation are shown and described.

The integrated circuit shown in FIG. 1 contains a self-test device in the form of a BIST module BIST, a test result memory formed in the example considered by a register block REGB, a number of interface circuits IPCT, and input terminals, formed by pads, as they are known, for the supply of an external clock signal EXTCLK, a first supply voltage Vdd that supplies the integrated circuit with power, with the exception of the register block REGB, a second supply voltage VddR that supplies only the register block REGB with power, a control signal $RST_{13}N$ that controls the BIST module BIST, a control signal ITESTMODE that controls the BIST module BIST and the register block REGB, and a control signal RSTREG_N that controls the register block REGB. It is possible for the terminal for the external clock signal EXTCLK to be dispensed with if the integrated circuit has an internal clock signal generator CLKGEN, which may be the case here.

The BIST module BIST: is supplied with power by the first supply voltage Vdd already mentioned, is clocked by a clock signal CLK generated by the internal clock signal generator CLKGEN, receives the control signals ITESTMODE and $RST_{13}$ N already mentioned from outside the integrated circuit, receives from the register block REGB a control signal READY, and data Q2 to Q5, and outputs to the register block REGB a control signal STROBE, and data D2 to D5.

The register block REGB: is supplied with power by the second supply voltage VddR already mentioned, is clocked by a clock signal CLK generated by the internal clock signal generator CLKGEN, receives the control signals ITESTMODE and $RSTREG_{13}$ N from outside the integrated circuit, receives the control signal STROBE and the data D2 to D5 from the BIST module BIST, outputs the control signal READY and the data Q2 to Q5 to the BIST module BIST, and outputs a control signal CLKOFF to the internal clock signal generator CLKGEN or to a device that can exert an influence on the external clock signal EXTCLK.

Figure 2:
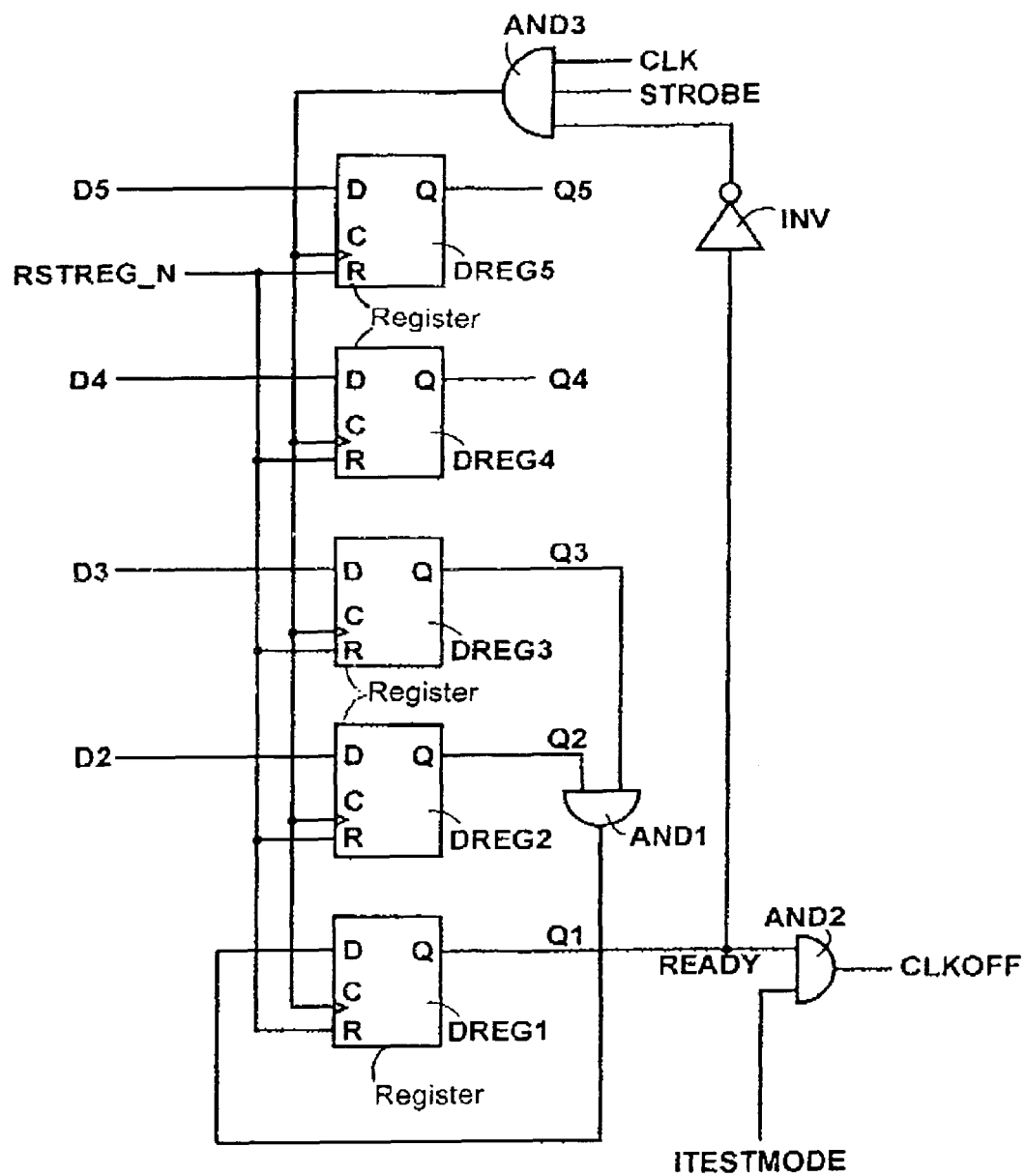
FIG. 2 shows the construction of a test result memory which is written to by the self-test device and that belongs to the integrated circuit shown in FIG. 1.

The construction of the register block REGB is shown in FIG. 2. The register block REGB in the example considered contains a number of registers (five in the example considered) DREG1 to DREG5, AND elements AND1 to AND3, and an inverter INV.

Of the registers DREG1 to DREG5, each contains a data input terminal D, a data output terminal Q, a reset terminal R and a clock terminal C. The output signal from the first AND element AND1 is input to the data input terminal D of the register DREG1. The data D2 to D5 is input to the data input terminal D of the registers DREG2 to DREG5. The data item Q1 (used as the READY signal) is output from the data output terminal Q of the register DREG1. The data Q2 to Q5 is output from the data output terminals Q of the registers DREG2 to DREG5. The signal $RSTREG_{13}$ N is applied to the reset terminals R of the registers DREG1 to DREG5. The output signal from the third AND element AND3 is applied to the clock terminals C of the registers DREG1 to DREG5. The first AND element AND1 forms an AND combination of the data Q2 and Q3 output from the output terminals Q of the registers DREG2 and DREG3. The second AND element AND2 generates an AND combination of the signals READY and ITESTMODE and generating a signal CLKOFF. The third AND element AND3 forms an AND combination of the signals CLK, STROBE and inverted READY.

The interface circuits IPCT already mentioned are connected upstream of the input terminals of the register block REGB for the signals generated within the integrated circuit, that is to say for the signals CLK, STROBE, D2, D3, D4 and D5. Their task is to ensure that the aforementioned signals assume defined states or waveforms when the devices that generate the signals are deactivated, which is the case in particular, as will be explained in more detail later, when the supply voltage Vdd supplying these devices with power is switched off; the aforementioned signals must not float.

Figure 3A:
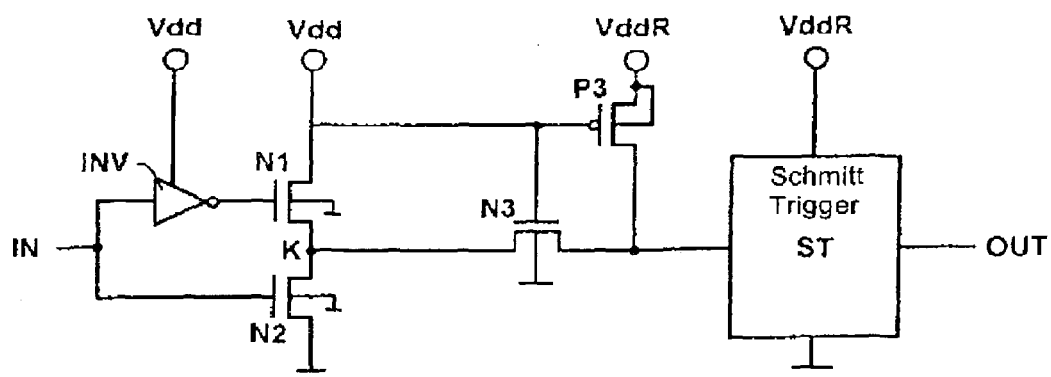
FIGS. 3A and 3B show the construction of interface circuits provided between the self-test device and the test result memory.
Figure 3B:
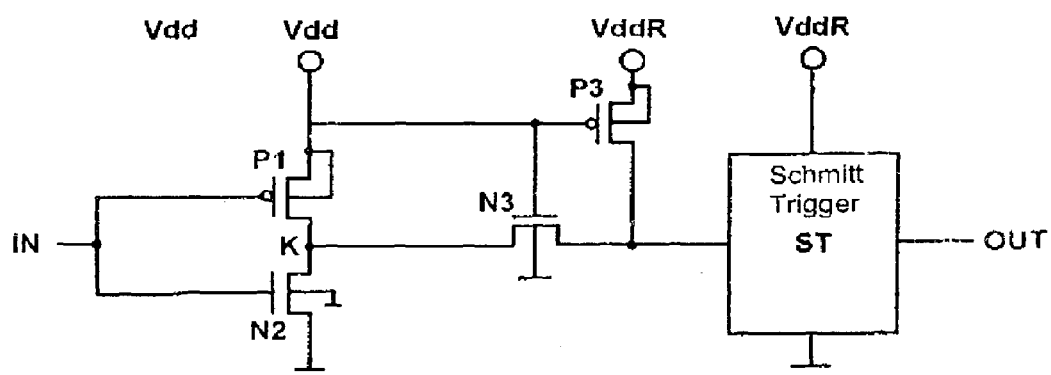

Two options for the practical implementation of such interface circuits are shown in FIG. 3A and FIG. 3B. These circuits ensure that defined potentials, more precisely VddR or 0 V, are supplied to the register block REGB both when the supply voltage Vdd is applied and when the supply voltage Vdd is switched off.

The interface circuits IPCT shown in FIGS. 3A and 3B differ only in the construction of the input stage, however, this has no influence on their function and mode of action.

The interface circuits IPCT shown in FIGS. 3A and 3B function as follows:

When the supply voltage Vdd (=VddR) is applied, the signal present on an input terminal IN is transmitted in inverted form to a junction K and onward from the latter, via a transistor N3, to a Schmitt trigger ST which, depending on the potential of the signal supplied to it (and therefore also depending on the signal supplied to the input terminal IN of the interface circuit IPCT), outputs VddR or 0 V. The output signal OUT of the Schmitt trigger ST forms the output signal from the respective interface circuit IPCT.

When Vdd is switched off, the transistor N3 turns off, and the voltage VddR is fed to the Schmitt trigger ST via a transistor P3, as a result of which, irrespective of the signal supplied to the input terminal IN of the interface circuit IPCT, VddR is output from the Schmitt trigger ST and the interface circuit IPCT.

The testing of the integrated circuit by the BIST module BIST proceeds as follows: At the start of the test, both supply voltages Vdd and VddR and control signals ITESTMODE=1, RST_N=0 and RSTREG_N=0 are applied. RST_N=0 and resets the BIST module BIST, RSTRWG_N=0 and resets the registers DREG1 to DREG5, and ITESTMQDE=1 and causes the BIST module (after the latter has been reset) to test the integrated circuit. After the expiration of a time, within which the BIST module BIST and the registers DREG1 to DREGS are reliably reset by the signals RST_N=0 and RSTREG_N=0, the signals RST_N and RSTREG_N are set to the value 1.

When the test of the integrated circuit carried out by the BIST module in response to the signal ITESTMODE=1 is concluded, the BIST module transmits data representing the test result and data representing the test status to the register block REGB.

In the example considered, two individual tests are carried out by the BIST module, and test result data and an item of test status data are generated for each individual test. These items of data each include one bit. Test result data with the value 0 indicates that the relevant test was not passed. Test result data with the value 1 indicates that the relevant test was passed successfully. Test status data with the value 0 indicates that the relevant test has not yet finished, and test status data with the value 1 indicates that the relevant test has finished.

In the example considered, the test result data are the data D4 and D5, and the test status data are the data D2 and D3.

Reference should be made at this point to the fact that the BIST module BIST can in principle carry out an arbitrary number of individual tests, and that the data about the tests that are output to the register block REGB can in principle be any desired amount of data, of any desired length, can be encoded in any desired way, and can represent any desired information.

The data is output by the BIST module BIST to the register block REGB, and if the STROBE signal already mentioned, more precisely STROBE=1, is output by the BIST module BIST at the same time, the data is taken into the registers D2 to D5 and is stored in the latter with the respective next rising edge of the clock signal CLK. Using the STROBE signal, the BIST module BIST can determine whether and, if appropriate, when data are stored in the register block REGB. This makes it impossible for the wrong data to be mistakenly written in the register block REGB, and makes it possible for the power consumption in the register block REGB to not be higher than is absolutely necessary.

When the BIST module BIST has finally carried out the two individual tests to be carried out by it, in each case the value 1 is present in the registers DREG2 and DREG3. The contents of these registers are subjected to an AND combination by the first AND element AND1, and the result of this AND combination is written to the register DREG1. The value stored in the register DREG1 therefore indicates whether the BIST module BIST has finally carried out all of the individual tests to be carried out by it. A DREG content of 0 indicates that the tests have not yet all finally been carried out, and a DREG content of 1 indicates that all the tests have been carried out.

The content of the register DREG1, which can be tapped off on the output terminal Q of the same, is the READY signal which has already been mentioned and which is output from the register block REGB to the BIST module BIST.

The READY signal also controls the value of the signal CLKOFF, and whether the clock terminals C of the registers DREG1 to DREG5 are supplied with a clock signal.

The signal CLKOFF is the result of the AND combination, formed by the AND element AND2, of the signals READY and ITESTMODE. Whether the clock terminals of the registers DREG1 to DREG5 are supplied with a clock signal depends on the result of the AND combination, formed by the AND element AND3, of the negated READY signal and the signals STROBE and CLK.

The signal CLKOFF becomes 1 when the integrated circuit is in the test operating mode (ITESTMODE=1) and the test carried out by the BIST module has been completed (READY=1). The signal CLKOFF is used for the purpose of preventing the clock signal CLK from being supplied to the register block REGB and to the remaining components of the integrated circuit. As a result, after the completion of the test carried out by the BIST module, the integrated circuit can automatically be put into a state in which it exhibits a minimal power consumption.

Figure 4:
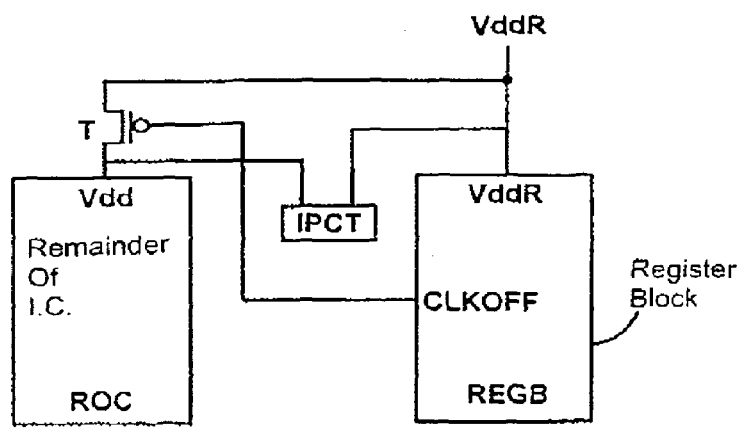
FIG. 4 shows a configuration by means of which, after completion of the self test, the supply voltage feed to specific parts of the integrated circuit is automatically interrupted.

It is even better if, additionally or alternatively, CLKOFF=1 is used to automatically switch off supply of the supply voltage Vdd that supplies the integrated circuit with power, with the exception of the supply VddR to the registered block REGB. One possibility for the practical implementation of this is for an output terminal belonging to the integrated circuit (a pad) to be provided for the signal CLKOFF, and for a switch provided outside the integrated circuit in the Vdd path and, for example, formed by a transistor, to be operated by the signal output via this pad. Another possibility for switching off the supply voltage is illustrated in FIG. 4. In the integrated circuit illustrated in FIG. 4, the switch by means of which Vdd is connected or disconnected is formed by a transistor T provided within the integrated circuit and controlled by CLKOFF. This has the positive effect that the integrated circuit only has to be supplied with a single supply voltage (VddR in the example considered) from the outside. This single supply voltage is supplied both to the register block and, via the transistor T, to the remainder of the integrated circuit, designated by ROC.

Interrupting the supply of Vdd is advantageous at times during which the integrated circuit has nothing else to do than to ensure that the data stored in the register block REGB are not lost, which, for example, is the case between the end of the test carried out by the BIST module and the time of reaching the external testing device that continues testing of the integrated circuit. As a result, the power consumption of the integrated circuit can be reduced, which is of great importance in particular when the test carried out by the BIST module is carried out simultaneously for all of the integrated circuits on one or more wafers.

The fact that, as has already been mentioned above, the clock terminals C of the registers DREG1 to DREG5 have a signal applied to them which is the result of an AND combination of the signals CLK, STROBE and the inverted signal READY, has the positive effect that, in the registers DREG1 to DREG5, it is possible to write data only when the BIST module permits this by outputting STROBE=1. Also, the writing of data into the registers DREG1 to DREG5 is automatically prevented when the tests to be carried out by the BIST module have been concluded.

The register block REGB can be kept in operation while the rest of the integrated circuit is deactivated or switched off. Also, by means of the self-locking mechanism described above, it is ensured that the results of the tests carried out by the BIST module, which are stored in the register block REGB, can no longer be overwritten under any circumstances after the conclusion of the test. These two factors provide ideal preconditions for permitting the data stored in the register block REGB to be read out and evaluated at any desired time after the end of the test.

In order to read out the data stored in the register block REGB and output the data from the integrated circuit (for example to the external testing device), ITESTMODE=0 and RST_N=0 are set and the signal RSTREG_N remains at the value 1.

Changing the signal ITESTMODE to the value 0 has the effect that the signal CLKOFF, generated on the basis of the former, likewise assumes the value 0. This has the effect that, in turn, the entire integrated circuit is supplied with power, and/or that the clock signal CLK is generated again (in the case of an internal clock generator) or is forwarded (in the case of an external clock generator).

Since the signal READY maintains the value 1 during this process, the registers DREG1 to DREG5 can still not be written, however.

The BIST module is reset by the signal RST_N=0. The signal RST_N is set to the value 1 again at a time at which it can be assumed that the BIST module has been reset. After that, it is possible to arrange for the integrated circuit to read out the data stored in the register block REGB and to output these data (data Q2 to Q5).

Figure 5:
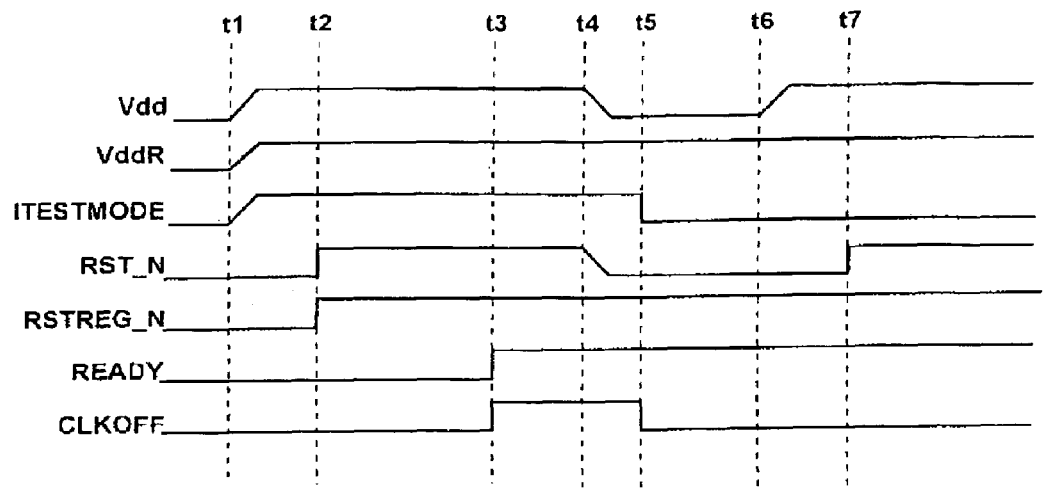
FIG. 5 shows the waveforms of specific voltages and signals which occur during testing of the integrated circuit shown in FIG. 1 by the self-test device.

The processes described above are illustrated in FIG. 5, which shows the waveforms of Vdd, VddR, ITESTMODE, RST_N, RSTREG_N, READY and CLKOFF. The following times are indicted in FIG. 5:

t1 designates the time at which the integrated circuit is started up, t2 designates the time at which resetting of the integrated circuit has been concluded and at which the test of the integrated circuit by the BIST module begins, t3 designates the time at which the self test has been concluded, t4 designates the time at which Vdd is switched off, t5 designates the time at which preparations to read out the test result memory are begun, t6 designates the time at which Vdd is switched on again, and t7 designates the time at which reading of the test result memory can be started.

Figure 6:
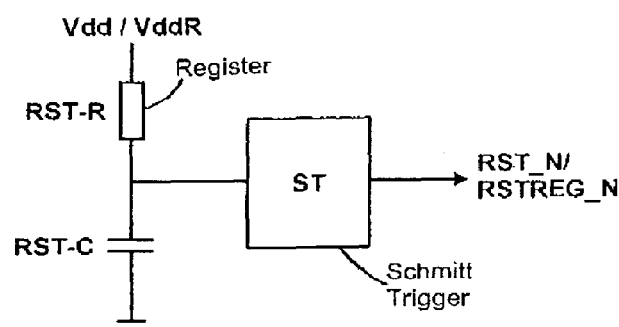
FIG. 6 shows a configuration for generating reset signals that reset parts of the integrated circuit, on the basis of the variation in the supply voltage provided for the parts of the integrated circuit to be reset.

As can be seen from the above explanations, contact only has to be made with a very small number of input and/or output terminals on the integrated circuit in order to test the integrated circuit using the BIST module contained in the latter. The number of input and/or output terminals with which contact has to be made can be reduced even further if the reset signals RST_N and RSTREG_N are generated within the integrated circuit based on the waveform of the supply voltages Vdd and VddR. A circuit for accomplishing this is shown in FIG. 6 and includes a resistor RST-R, a capacitor RST-C and a Schmitt trigger ST. If this option is used, then the input terminals (pads) provided for the signals RST_N and RSTREG_N on the integrated circuit can be dispensed with, and in order to test the integrated circuit with the BIST module contained therein, contact has to be made with even fewer input and/or output terminals of the integrated circuit than would otherwise be the case.

The supply of power to the register block REGB, provided via the supply voltage VddR, is maintained uninterruptedly at least until the integrated circuit is connected to the external testing device and until the data stored in the register block are read out by means of the external testing device. However, the voltage source which supplies the supply voltage VddR and/or the contact-making elements via which the supply voltage VddR is applied to the integrated circuit may change. This is virtually inevitable, for example, when the integrated circuit is taken by a transport device that transports it to the external testing device, in order to be transported onward by a different transport device, in order to be stored temporarily, or in order to be connected to the testing device. In cases in which this is too complicated or impossible, the supply of the integrated circuit with the supply voltage VddR can be provided by a battery connected to the integrated circuit and carried along with the latter, or by a capacitor. This will be discussed in more detail later.

Furthermore, it must of course be ensured that the integrated circuit is supplied with the control signals RST_N, RSTREG_N and ITESTMODE, and if necessary with the clock signal CLK, during the test that is carried out by the BIST module. This can be done by means of a very simply constructed control device which, in the case in which the test is carried out while the integrated circuit is being transported to the external testing device, is preferably a control device which can be carried along with the integrated circuit, at least during the test.

The test to be carried out by the BIST module is preferably carried out simultaneously in a plurality of integrated circuits, for example, in all of the integrated circuits belonging to one or more wafers.

The simultaneous performance of the test to be carried out by the BIST module in all of the integrated circuits belonging to a wafer may be implemented particularly simply in the case of a wafer as described below.

A wafer of this type is distinguished, inter alia, by the fact that, at least the points on the integrated circuits that receive the voltages and signals that are required for testing the integrated circuits using the BIST modules are connected electrically to one another.

Figure 7:
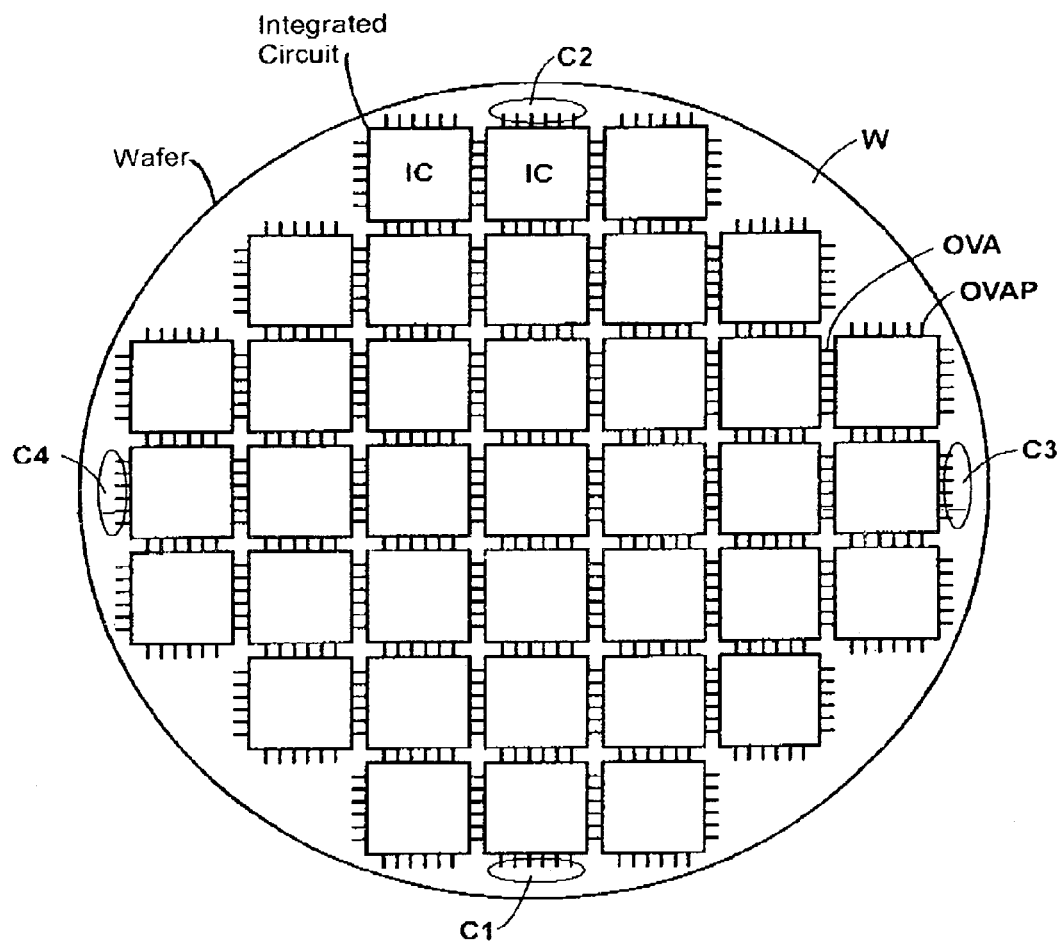
FIG. 7 shows a wafer carrying a large number of integrated circuits.

One such wafer is illustrated in FIG. 7. In this case, the wafer is designated by the reference symbol W, the integrated circuits produced on it are designated by the reference symbol IC, and the electrical connections between the integrated circuits IC are designated by the reference symbol OVA. In the example considered, the electrical connections OVA interconnect the points on the integrated circuits to which the supply voltages Vdd and VddR, the ground potential GND and the signals RST_N, RSTREG_N and ITESTMODE have to be supplied.

Figure 8:
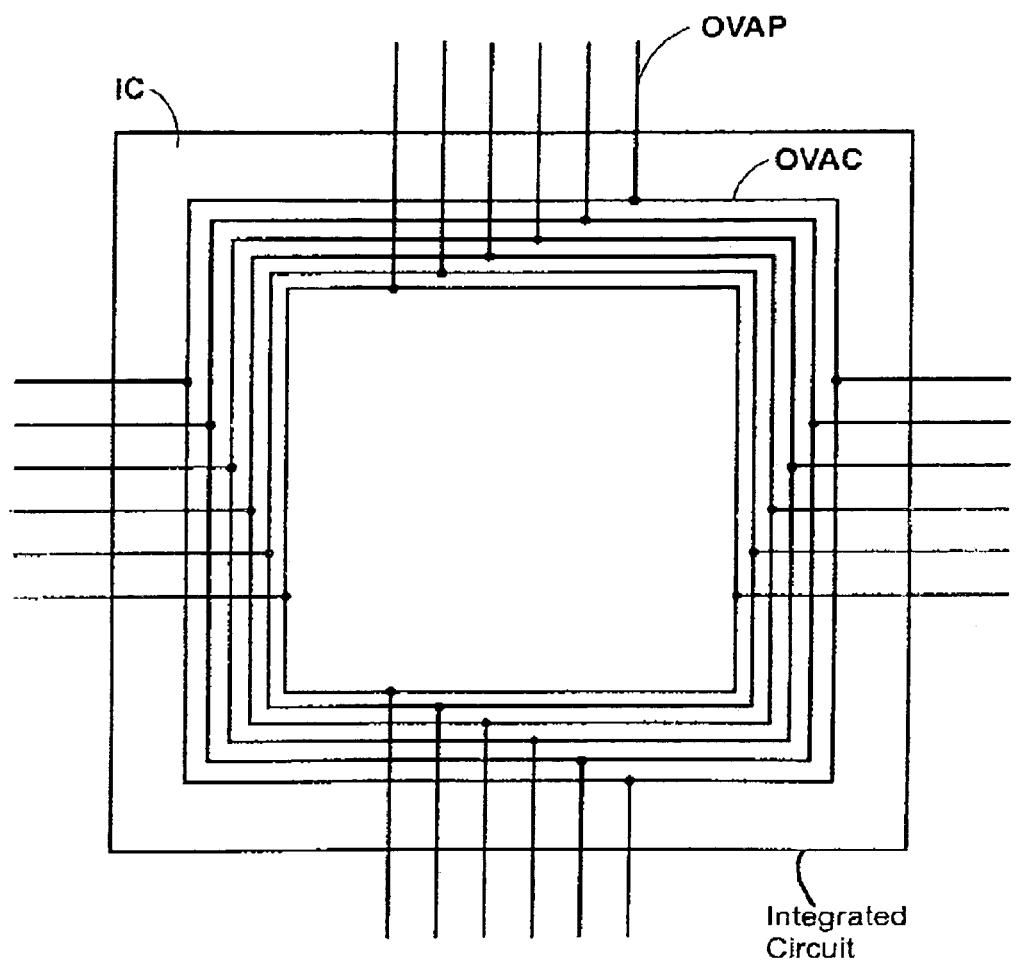
FIG. 8 shows the construction of one of the integrated circuits on the wafer shown in FIG. 7.

In the example considered, the electrical connections OVA are formed by line sections leading out from the integrated circuits IC, projecting into the interspaces present between adjacent integrated circuits IC and there overlapping with the respectively associated line sections of the adjacent integrated circuits. Such line sections lead away from a plurality of sides, preferably from all four sides of the integrated circuit. The line sections leading away from the various sides of the integrated circuit are interconnected by means of lines running inside or outside the integrated circuit. Such an integrated circuit is illustrated by way of example in FIG. 8. In this case, the line sections provided to form the connections OVA are designated by the reference symbol OVAP, and the lines connecting these are designated by the reference symbol OVAC. At this point, reference should be made to the fact that the lines OVAC that connect the line sections OVAP to one another can also have any other desired course and can also run outside the integrated circuits (in the interspaces present between adjacent integrated circuits). In the example considered, the lines OVAC that connect the line sections OVAP to one another are a constituent part of one of the conductive layers of the integrated circuit. The lines, for example, consist of AlSiCu or of Cu sheathed with Ti or Ti/N.

In the example considered, the line sections OVAP extending beyond the integrated circuits (into the interspaces, also referred to as the snap frame, between adjacent integrated circuits) are produced together with the integrated circuits; in the operations during which the line sections OVAP are produced, masks (reticules) are used which cover a region going beyond the edge of the integrated circuit to be produced.

Figure 9:
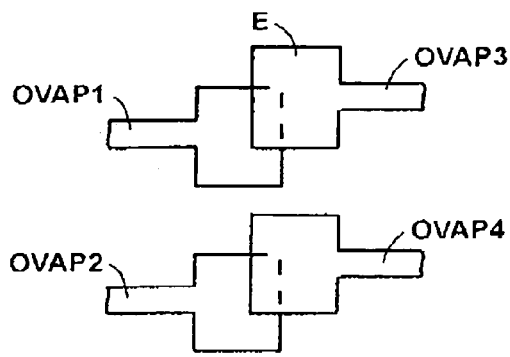
FIG. 9 shows electrical connections via which the integrated circuits on the wafer shown in FIG. 7 are connected to one another.

The integrated circuits belonging to a wafer are produced in a large number of successive steps (deposition, exposure, etching, oxidization, implantation, lithography steps etc.), but without normally carrying out every step simultaneously for all of the integrated circuits. Specific steps, for example, the exposure of a resist, are carried out individually and successively for each integrated circuit or for groups of integrated circuits each containing a plurality of integrated circuits. This can lead to the situation where no proper connections OVA are produced between integrated circuits which are not processed (for example exposed) together. This can have various causes: first, it may occur that the mutually associated line sections OVAP of adjacent integrated circuits or of adjacent groups of integrated circuits which are not exposed together do not align with one another, and secondly, it may occur that, at the points at which they overlap, the connections OVA can become narrower or wider locally as a result of double exposure at these points, and as a result, become so narrow that no good connection is produced, or become so wide that adjacent connections OVA come into contact with each other. This can be prevented by providing a larger spacing between adjacent line sections OVAP than is usual in the technology used, and by designing the free ends (those that come to lie in the interspace between adjacent integrated circuits) of the line sections OVAP to be wider than the rest of the line sections. This is illustrated in FIG. 9. FIG. 9 shows line sections OVAP1 and OVAP2 of a first integrated circuit, and line sections OVAP3 and OVAP4 of a second integrated circuit that are not exposed together with the first integrated circuit. The line sections OVAP1 to OVAP4 have end portions E which are widened as compared with the remainder. As can be seen from FIG. 9, the line sections OVAP1 and OVAP3, and respectively, OVAP2 and OVAP4 which are to be brought into contact with one another are properly in contact even when they are not aligned with one another. Because of the particularly large spacings between OVAP1 and OVAP2 and, respectively, between OVAP3 and OVAP4, there is no risk either that short circuits will be produced.

In the case of a wafer in which a plurality or all of the integrated circuits formed on it are connected to one another as described or in a different manner, in order to initiate and to carry out the testing by the BIST modules contained in the integrated circuits, it is sufficient for the voltages and the signals to be supplied to the wafer only at a single point or at a few points, for example, in one of the contact zones designated in FIG. 7 by the reference symbols C1, C2, C3 and C4.

Figure 10A:
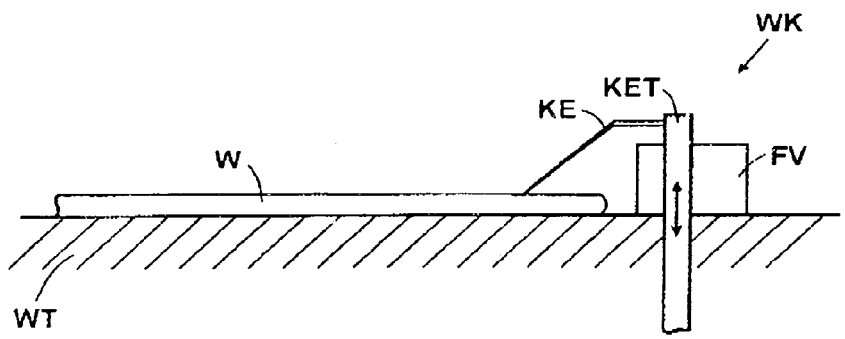
FIGS. 10A and 10B show a wafer contacting device, by means of which contact can be made with contact points provided on the wafer shown in FIG. 7.
Figure 10B:
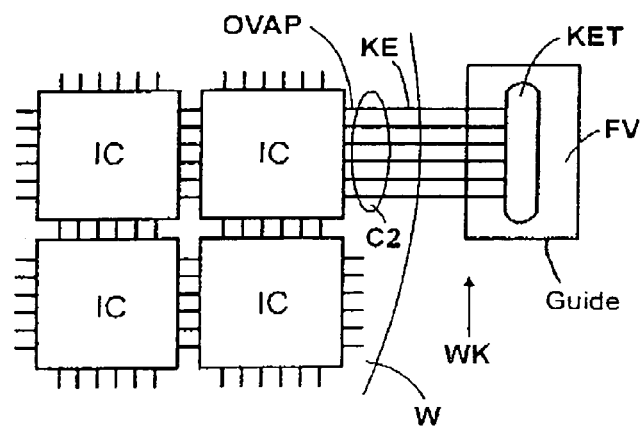

A configuration by means of which this can be done is shown in FIGS. 10A and 10B. FIGS. 10A and 10B show a (wafer) carrier or chuck WT, a wafer W placed on the carrier WT and a (wafer) contact-making device WK. The contact-making device WK includes a rod KET which can be moved to and fro in the longitudinal direction, contact pins KE fixed to the rod, and a guide device FV for guiding the rod KET carrying the contact pins KE.

The rod KET can be moved up and down together with the pins KE carried by it. When the rod KET is located in the lower position, the pins KE come into contact with the contact points formed in the contact zone with which contact is made (in one of the contact zones C1 to C4). These contact points can be formed by the line sections OVAP (preferably by the broadened end portions E of the same) that are present in the relevant contact zone. In the position in which the rod KET is shifted upward, there is no contact between the pins KE and the wafer.

The fact that the wafer has a plurality of contact zones C1 to C4 (four in the example considered but possibly also more or fewer), by which in each case all of the integrated circuits IC provided on the wafer can be supplied with the voltages and the signals needed for testing the same using the BIST modules contained therein, means that the supply of the voltages and the signals can then be maintained even if the wafer—for whatever reason—has to be removed from the carrier carrying it.

Figure 11A:
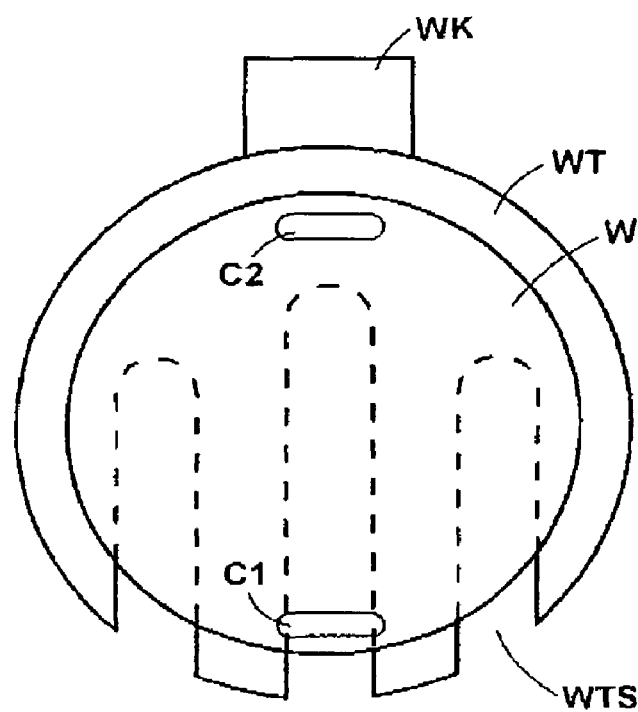
Figure 11A:
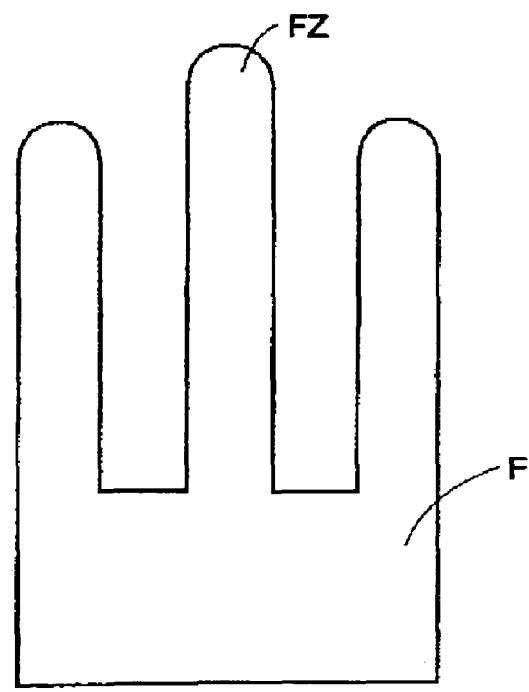
Figure 11C:
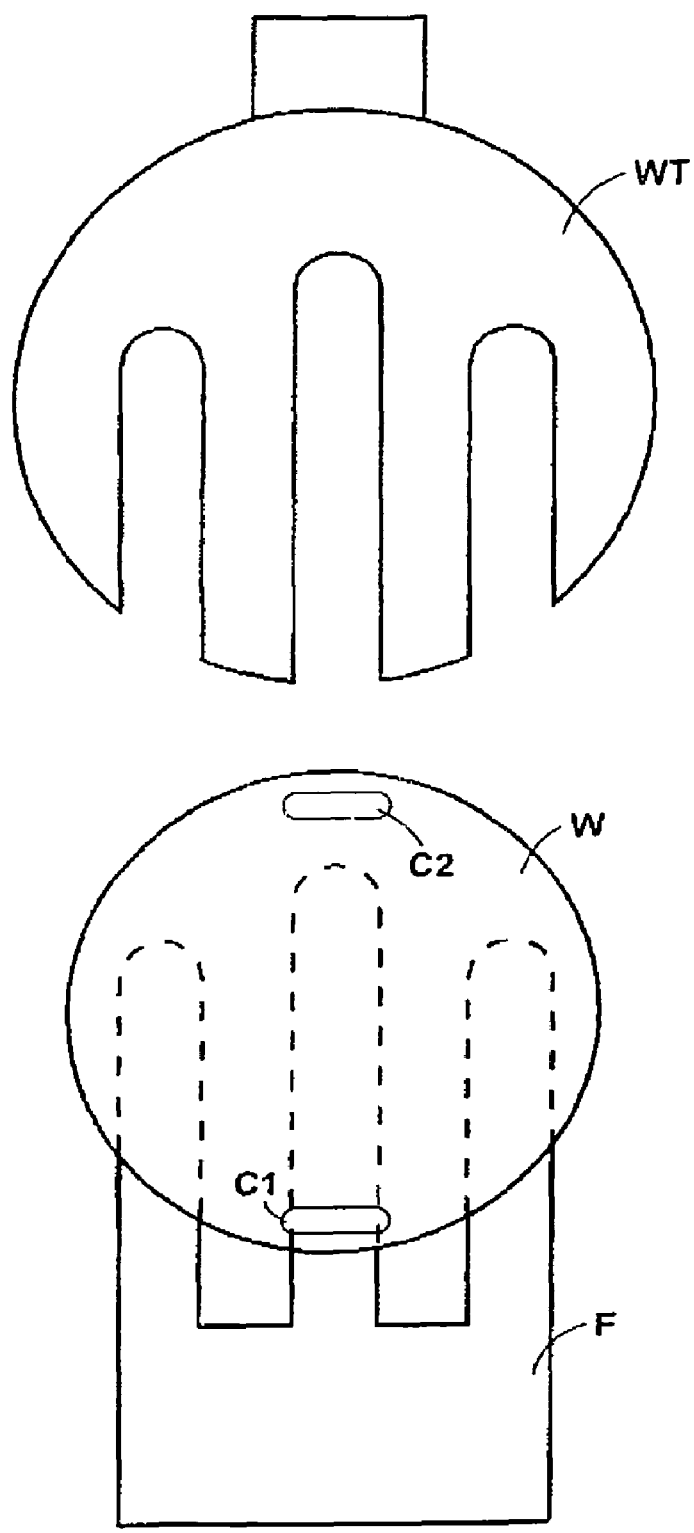

One possible way of removing the wafer W from the carrier WT while uninterruptedly maintaining the supply of the aforementioned voltages and signals to the integrated circuits is illustrated schematically in FIGS. 11A to 11C. The device that removes the wafer W from the wafer carrier WT in the example considered is a fork F, whose prongs FZ can be inserted from the side of the carrier WT into associated slot-like recesses WTS in the carrier WT and can pull the wafer W away from the carrier WT whilst lifting the wafer slightly. FIG. 11A shows the state in which the wafer W is still on the carrier WT and is still being supplied with the voltages and signals needed by the integrated circuits via the contact zone C2. FIG. 11B shows the state in which the fork F has been pushed into the wafer carrier. At this stage, the wafer initially continues to be supplied with the voltages and signals needed by the integrated circuits via the contact zone C2. After the fork F has reached a specific relative position in relation to the wafer W (or the carrier WT carrying the latter), the contact points provided in the contact zone C1 of the wafer W have contact made with them by a contact-making device which is not shown in the Figures, but which is arranged on the fork F. As a result of which, the integrated circuits provided on the wafer are then also supplied with the voltages and the signals needed by them via the contact zone C1. After this has been done, the supply of the voltages and the signals needed by the integrated circuits via the contact zone C2 is interrupted by detecting the appropriate electrical connections. As has already been indicated, interrupting this connection does not result in interruption of the voltages and signals needed by the integrated circuits. These have been and are certainly still supplied via the contact zone C1. After that, the wafer W can be lifted slightly by the fork F and drawn away from the carrier WT together with the fork; this is illustrated in FIG. 11C.

Removing the wafer W from the wafer carrier WT as described is preferably carried out at a time at which the test of the integrated circuits carried out by the BIST module has already been completed. It is then necessary for the integrated circuits still to be supplied only with the supply voltage VddR via the fork F and the contact zone C1. This can be effected, for example, by means of a battery or a capacitor, which is provided in the device that removes the wafer W from the wafer carrier WT. If a capacitor is used, the capacitor can be charged up during the time that contact is made with the wafer both via the contact zone C1 and via the contact zone C2, and this can be accomplished using the power that is supplied to the wafer via the contact zone C2.

It would also be conceivable to supply the wafer with the supply voltages Vdd and/or VddR by using a battery permanently connected to the wafer or by using a capacitor permanently connected to the wafer. Under certain circumstances, this dispenses with the necessity of making contact with the wafer, as the latter is removed from the wafer carrier, via a contact-making device provided on the removal device.

Figure 12:
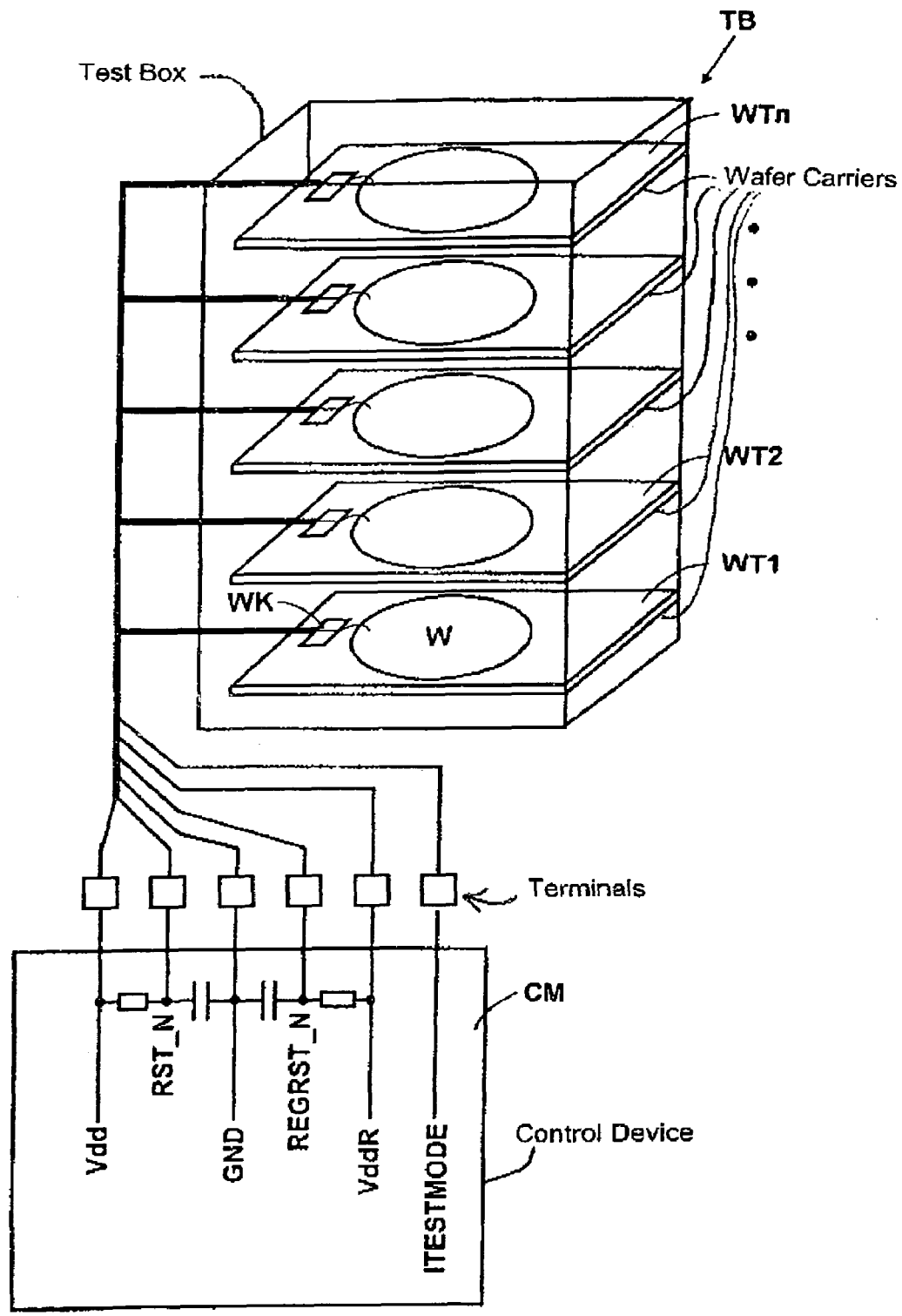
FIG. 12 shows a test box, in which the integrated circuits of a plurality of wafers can be tested simultaneously by the self-test devices contained in them.

Provision can also be made to test the integrated circuits of a plurality of wafers simultaneously. This is possible, for example, by means of a test box TB shown in FIG. 12. The test box TB shown contains a housing and a plurality of wafer carriers WT1 to WTn which are arranged one above another and which are constructed in the same way as or similarly to the wafer carrier WT described with reference to FIGS. 10 and 11.

In particular, each wafer carrier contains a contact-making device WK, the contact-making devices of all the wafer carriers are connected to a common control device CM that provides and generates the necessary voltages and signals. The control device CM is either transported together with the test box, or is connected to the contact-making devices WK via lines which are so long that the test box TB and the control device CM can be moved relative to each other. The simultaneous testing of the integrated circuits produced on a plurality of wafers makes it possible to reduce to a minimum the number of control devices CM to be provided for this purpose.

Figure 13:
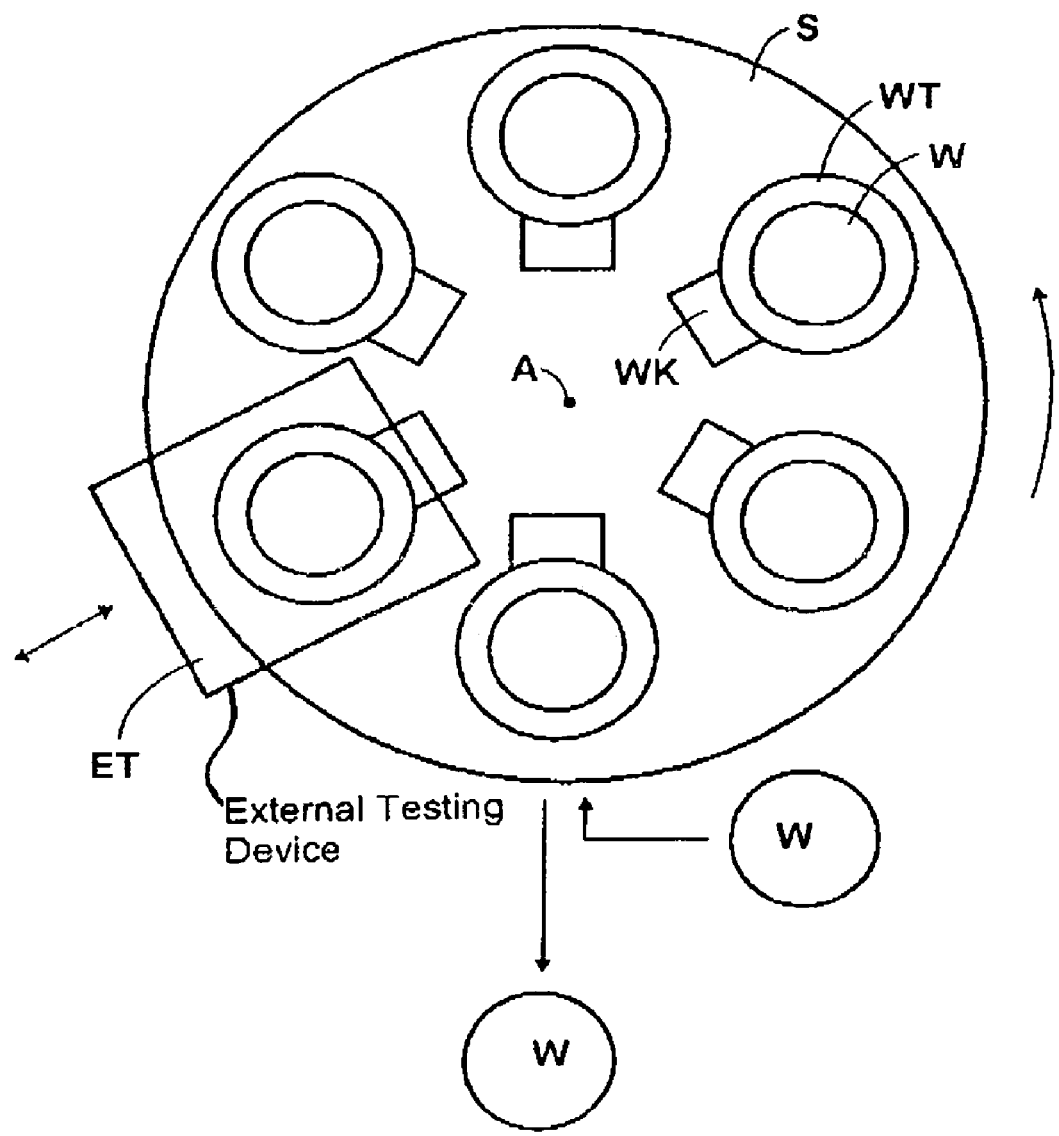
FIG. 13 shows a configuration in which the integrated circuits to be tested are transported on a turntable to an external testing device, and on the way there, are tested by the self-test devices contained in them.

It should be clear that the simultaneous testing of the integrated circuits of a plurality of wafers can also be carried out in a different way than by using the test box TB described above. One possibility for this is illustrated in FIG. 13. In the arrangement illustrated in FIG. 13, the wafer carriers WT1 . . . WTn are arranged one beside another on a disk S that can be rotated about an axis A. The wafer carriers WT1 . . . WTn are once again constructed in the same way as or in a similar way to the wafer carriers WT described with reference to FIGS. 10 and 11. Arranged beside the rotating disk S is an external testing device ET. Each time a wafer carrier WT with a wafer W located on it runs past the external testing device ET, the disk S is stopped and the following is performed:

the integrated circuits IC on the wafer W are tested, the wafer W whose integrated circuits have previously been tested are removed from the wafer carrier WT carrying them, the next wafer is placed on the wafer carrier from which the previous wafer was removed, and testing of the newly added wafer is started, immediately or later.

Such a configuration has the advantage that, during the entire test process of the integrated circuits provided on the wafer, the wafers can remain lying on the wafer carriers WT1 to WTn and do not have to be moved around in between times.

It should be clear that the device carrying the wafer carrier may also be a conveyor belt or any other desired transport device by means of which the wafer carriers, with the wafers arranged on them, can be conveyed to the external testing device.

Given appropriate modification, the method of testing integrated circuits described above can also be employed in the case of semiconductor chips containing integrated circuits and in the case of components containing semiconductor chips.

Figure 14:
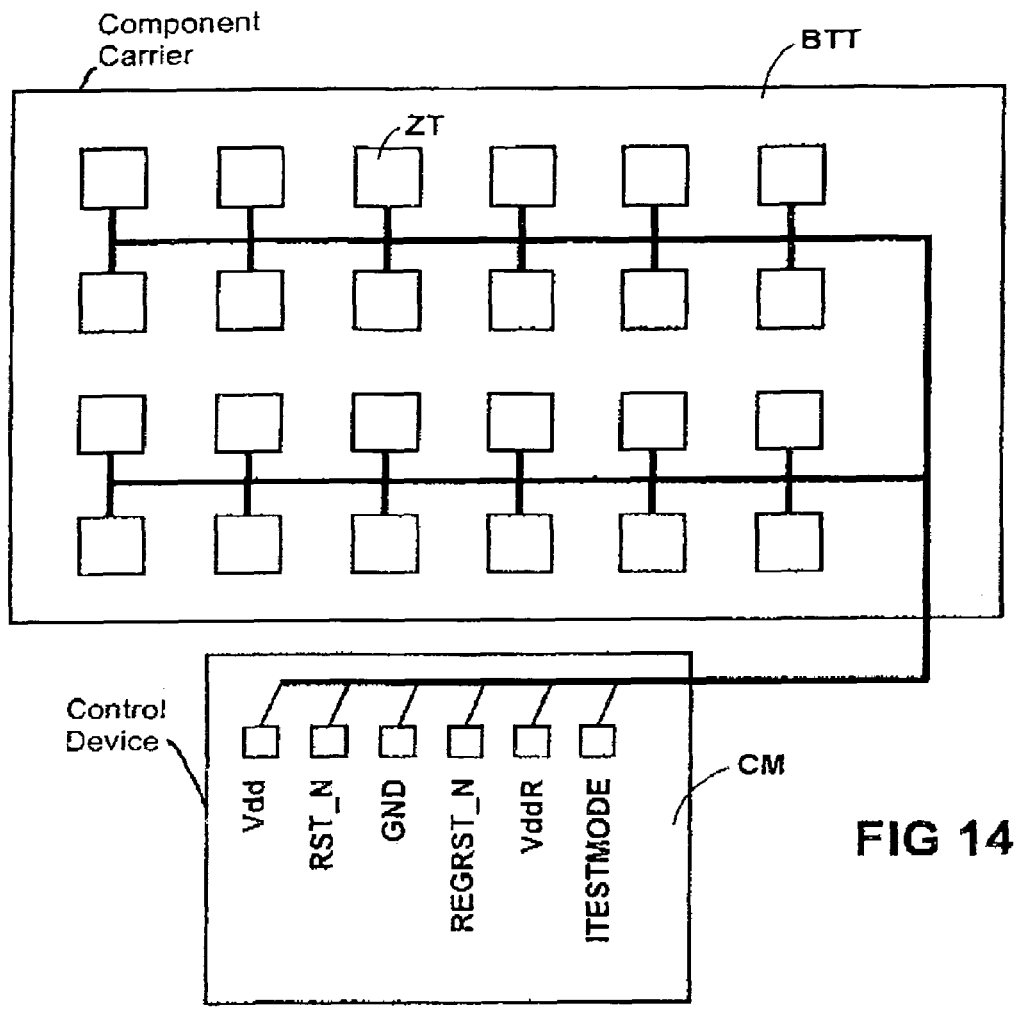
FIG. 14 shows a configuration by means of which components containing semiconductor chips can be tested efficiently.

A configuration by means of which components containing semiconductor chips can be tested is illustrated in FIG. 14.

The arrangement shown in FIG. 14 includes a component carrier BTT carrying a large number of components BT to be tested, and a control device CM, which ensures that testing of the components by means of the BIST modules contained in them (in the integrated circuits of the same) is at least begun before they are connected to an external testing device (for the purpose of evaluating the self-test results and/or for continued testing). The control device CM supplies the components with the voltages and signals which are needed to initiate and carry out the testing of the same by means of the BIST modules present in them, that is to say, for example, Vdd, VddR, GND, RST_N, RSTREG_N and ITESTMODE. The components are driven, at least partially, in parallel, as a result of which in each case a plurality of components BT or all of the components BT on the component carrier BTT can be tested simultaneously by the BIST modules contained in them.

Figure 15A:
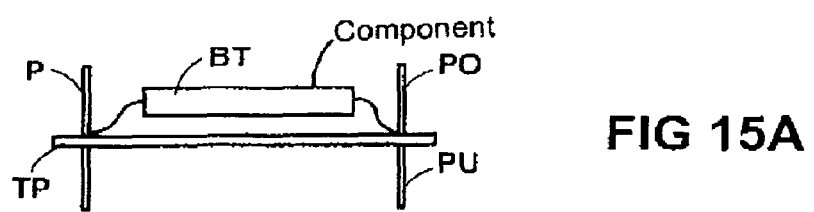
FIGS. 15A and 15B show various views of a component carrier employed in the configuration shown in FIG. 14.
Figure 15B:
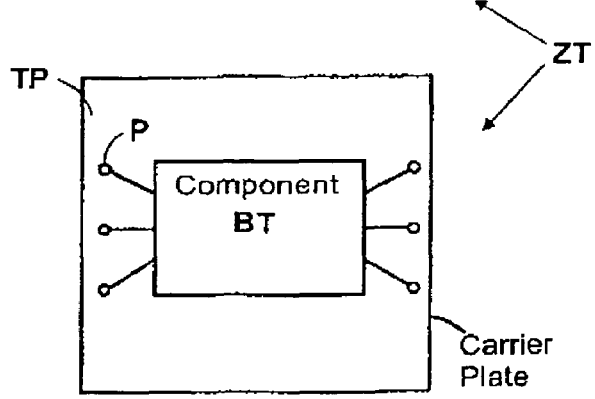

The arrangement of the components BT on the component carrier BTT is preferably carried out by means of an intermediate carrier which carries the components, which can be placed on the component carrier BTT, and which (together with the components) can be removed from the component carrier in such a way that the supply of the voltages and signals which must be supplied to the components at the relevant time is not interrupted. An exemplary embodiment of such an intermediate carrier is shown in FIGS. 15A and 15B. The intermediate carrier shown in FIGS. 15A and 15B and designated by the reference signal ZT is a carrier plate TP having pins P running through it. The component BT is placed on the intermediate carrier ZT and is fixed in such a way that the component terminals, which are needed for testing the component by means of the BIST module, and the external testing device are connected electrically to respectively associated pins. A component placed on such an intermediate carrier is optionally able to be supplied with the voltages and the signals which have to be supplied to it for testing by means of the BIST module via the pin parts PU running underneath the carrier plate TP or via the pin parts PO running above the carrier plate TP. The supply is carried out via the lower pin parts PU when and as long as the intermediate carrier ZT is placed on the carrier plate TP. The supply is carried out via the upper pin parts PO when the intermediate carrier ZT is removed from the carrier plate TP (for example in order to be connected to the external testing device that continues the component test). Semiconductor chips can also be tested in a similar way.

The method and devices described make it possible to test integrated circuits rapidly and simply, irrespective of the details of the practical implementation.

FIG. 16 shows a block diagram illustrating steps of the method 100 of testing an integrated circuit IC. Step 110 includes providing a plurality of integrated circuits IC on at least one wafer W. Step 120 includes providing each integrated circuit IC with a self-test device BIST. Step 130 includes providing a self-test control device BIST that causes performance of the test of the integrated circuit IC. Step 140 includes either temporarily storing a plurality of integrated circuits IC or moving the self-test control device CM (See FIG. 12) together with the plurality of integrated circuits IC while simultaneously at least partially completing the testing of the plurality of integrated circuits IC with the self-test devices BIST. Step 150 includes using each self-test device BIST to write data into a test result memory REGB that is located on the integrated circuit IC with the self-test device BIST. Step 160 includes taking at least parts of an integrated circuit IC out of operation after the self-test device BIST that is located on the integrated circuit IC has tested the parts. The parts of the integrated circuit IC can be taken out of operation by preventing a clock signal from being supplied to the parts of the integrated circuit IC. This clock signal is needed to operate the integrated circuit IC. The parts of the integrated circuit IC can additionally or alternatively be taken out of operation by discontinuing a supply voltage to the parts of the integrated circuit. This supply voltage supplies the integrated circuit IC with power. Step 170 includes after testing the integrated circuit IC with the self-test device BIST, taking out of operation, components of the integrated circuit IC that are not needed to continue to store the data in the test result memory REGB. Step 180 includes after completing the testing, then connecting an integrated circuit IC to an external testing device ET that reads out results of the test and/or evaluates the results of the test.

I claim:

1. A method of testing an integrated circuit, which comprises:
   providing an integrated circuit that includes a self-test device;
   starting to perform a test of the integrated circuit with the self-test device;
   taking at least parts of the integrated circuit out of operation after the parts have been tested by the self-test device; and
   subsequently, connecting the integrated circuit to an external testing device that performs a function selected from the group consisting of reading out results of the test and evaluating the results of the test.

2. The method according to claim 1, which comprises completing the test before performing the step of connecting the integrated circuit to the external testing device.

3. The method according to claim 1, which comprises at least partially completing the test while performing a function selected from the group consisting of temporarily storing the integrated circuit and transporting the integrated circuit to the external testing device.

4. The method according to claim 3, which comprises:
   providing a self-test control device that causes performance of the test of the integrated circuit; and
   moving the control device together with the integrated circuit.

5. The method according to claim 1, which comprises:
   with the self-test device, writing data into a test result memory; and
   after testing the integrated circuit with the self-test device, taking out of operation, components of the integrated circuit that are not needed to continue to store the data in the test result memory.

6. The method according to claim 1, wherein the step of taking at least parts of the integrated circuit Out of operation includes preventing a clock signal from being supplied, which is needed to operate the integrated circuit, to the parts of the integrated circuit.

7. The method according to claim 1, wherein the step of taking at least parts of the integrated circuit out of operation includes discontinuing a supply voltage, which supplies the integrated circuit with power, to the parts of the integrated circuit.

8. The method according to claim 1, which comprises simultaneously testing a plurality of integrated circuits with the self-test device.

9. The method according to claim 8, which comprises providing the plurality of the integrated circuits on at least one wafer.

10. The method according to claim 1, which comprises at least partially completing the test while transporting the integrated circuit to the external testing device.

11. An apparatus for testing an integrated circuit using a self-test device that is located in the integrated circuit, which comprises:
a self-test control device for causing testing of the integrated circuit by the self-test device before the integrated circuit is connected to an external testing device that performs a function selected from the group consisting of reading out results of the test and evaluating the results of the test;
a test result memory located on the integrated circuit for storing the results of the test;
an output circuit for forwarding the results stored in said test result memory to the external test device.

12. The apparatus according to claim 11, wherein said self-test control device is configured to complete the testing of the integrated circuit before the integrated circuit is connected to the external testing device.

13. The apparatus according to claim 11, wherein said self-test control device is configured to test the integrated circuit while allowing a function, selected from the group consisting of temporarily storing the integrated circuit and transporting the integrated circuit to the external testing device, to be performed.

14. The apparatus according to claim 11, wherein said self-test control device is constructed to be moved together with the integrated circuit.

15. The apparatus according to claim 11, in combination with the external testing device, wherein the external testing device tests aspects of the integrated circuit that are not tested by the self-test device, the aspects selected from the group consisting of components of the integrated circuit and functions of the integrated circuit.

16. The apparatus of claim 11, wherein said results are transferred to the external test device, when requested by the external test device.

17. The apparatus according to claim 11, wherein said self-test control device is configured to test the integrated circuit while the integrated circuit is being transported to the external testing device.

18. An integrated circuit, comprising:
components;
a self-test device for testing said components; and
a device in electrical communication with said self-test device for, at a particular time, taking specific ones of said components out of operation, said device preventing a clock signal, needed to operate said components, from being applied to said specific ones of said components;
the particular time selected from the group consisting of during the testing and after the testing.

19. The integrated circuit according to claim 18, comprising:
a test result memory for receiving data from said self-test device and for storing the data;
said specific ones of said components being ones of said components that are not needed in order to continue to store the data stored in said test result memory.

20. The integrated circuit according to claim 18, wherein said device prevents a supply voltage, which is needed to operate said components, from being applied to said specific ones of said components.

21. The integrated circuit according to claim 18, which comprises:
a test result memory for receiving data from said self-test device and for storing the data; and
a device for insuring that the data can not be changed after completion of the testing by said serf-test device.

22. The integrated circuit according to claim 18, which comprises:
a test result memory for receiving data from said self-test device and for storing the data; and
a device for using the data stored in said test result memory to determine whether the testing has been completed.

23. The integrated circuit according to claim 18, comprising at least two different points for receiving voltages and signals that have to be supplied so that said self-test device can test said components.

24. The integrated circuit according to claim 23, wherein said at least two different points are electrically connected together.

25. An integrated circuit, comprising:
components;
a self-test device for testing said components;
a device in electrical communication with said self-test device for, at a particular time, taking specific ones of said components out of operation, said device preventing a supply voltage, needed to operate said components, from being applied to said specific ones of said components; and
the particular time selected from the group consisting of during the testing and after the testing.

* * * * *